(12) United States Patent
Frännhagen et al.

(10) Patent No.: US 6,175,321 B1
(45) Date of Patent: *Jan. 16, 2001

(54) APPARATUS AND METHOD FOR THE REDUCTION OF PERIODIC NOISE IN A SIGMA-DELTA MODULATOR

(75) Inventors: Mats Olof Frännhagen, Mountain View, CA (US); Per Henrik Fremrot, Lund (SE)

(73) Assignee: Telefonakitiebolaget LM, Stockholm (SE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/084,650

(22) Filed: May 26, 1998

(30) Foreign Application Priority Data

May 27, 1997 (SE) .................................................... 9701986

(51) Int. Cl.[7] .................................................... H03M 3/00
(52) U.S. Cl. ............................................ 341/143; 341/131
(58) Field of Search ........................................ 341/143, 131

(56) References Cited

U.S. PATENT DOCUMENTS

| | | | |
|---|---|---|---|
| 3,999,129 | * 12/1976 | Kasson | 341/131 |
| 4,761,634 | * 8/1988 | Yamaguchi et al. | 341/131 |
| 4,968,987 | * 11/1990 | Naka et al. | 341/143 |
| 5,010,347 | 4/1991 | Yukawa | 341/143 |
| 5,055,843 | * 10/1991 | Ferguson, Jr. et al. | 341/143 |
| 5,073,777 | * 12/1991 | Fukuhara et al. | 341/131 |

FOREIGN PATENT DOCUMENTS

0709969 A2   5/1996   (EP).

OTHER PUBLICATIONS

PCT International–Type Search Report, Apr. 7, 1998, Search request No. SE 97/00671, pp. 1–6.

* cited by examiner

Primary Examiner—Michael Tokar
Assistant Examiner—Jean B. Jeanglaude
(74) Attorney, Agent, or Firm—Jenkens & Gilchrist, P.C.

(57) ABSTRACT

The present invention relates to an apparatus and a method for sigma-delta modulation with a reduced periodic noise (idle noise) in a sigma-delta modulator. The reduction is achieved by means of addition of two different Dither signals (217,218) to the sigma-delta modulator. A first Dither signal (218) is constituted by a particular bit pattern of a certain period while a second Dither signal (217) is constituted by a pseudo-random signal of a certain other period.

29 Claims, 4 Drawing Sheets

APPARATUS AND METHOD FOR THE REDUCTION OF PERIODIC NOISE IN A SIGMA-DELTA MODULATOR

TECHNICAL FIELD

The present invention relates to a method of sigma-delta modulation with reduced periodic noise.

DESCRIPTION OF RELATED ART

In most audio devices, for example, mobile telephones or CD-players in which an analogue/digital or digital/analogue conversion is carried out, often a sigma-delta modulator is used in the analogue/digital or digital/analogue converter.

A sigma-delta modulator according to prior art comprises a number of integrators, a number of amplifiers and a quantifier. These are arranged in a way characteristic to the sigma-delta modulator. The configuration of a sigma/delta modulator is described below.

In a sigma-delta modulator there arises, when its input signal is low, constant, or changes slowly, a so-called periodic noise, or idle tones. Even if the periodic noise has a relatively low amplitude it is fully audible to the human ear. This noise must therefore be reduced to a non-audible level.

In EP 0 709 959 A2, a sigma-delta modulator reducing periodic noise by means of a Dither signal is disclosed. The Dither signal is a random signal, for example, a pseudo-noise code (PN-code). This Dither signal may be added in one or more places in the sigma-delta modulator. Depending on where the addition of the Dither signal in the sigma-delta modulator is carried out, the signal is filtered by a particular filter before the addition.

A preferred length of the PN-code is that the period of the PN-code is much-longer than the period of the lowest frequency to be treated by the sigma-delta modulator. The PN-code should be at least 21 bits long. The rectified AC-power of the Dither signal is dependent on the order of the sigma-delta modulator.

One disadvantage of this solution is that depending on where it is chosen to add the Dither signal, one or more filters will be needed.

Another common solution for reducing the periodic noise in the sigma-delta modulator is adding the Dither signal in one of the integrators. The Dither signal is added without filtering.

This solution also has the disadvantage that the performance of the sigma-delta modulator is deteriorated.

A deterioration of the signal/noise ratio in the sigma-delta modulator implies that the complexity of the sigma-delta modulator must be increased. This means that a larger number of integrators must be used in the sigma-delta modulation to maintain the desired level of performance.

If the sigma-delta modulator is comprised in a D/A-converter, there is another solution to the deterioration of the signal/noise ratio. It is then possible to increase the over-sampling rate in an interpolation filter in the D/A-converter or increase the complexity of a low-pass filter arranged at the output of the signal-delta modulator.

The three solutions mentioned above, however, lead to an increased power consumption and an increased complexity of the sigma/delta modulator, which is not desirable for radio communication devices, such as mobile telephones.

SUMMARY OF THE INVENTION

The present invention attacks the problem of reducing periodic noise (idle tones) in a sigma-delta modulator.

Another problem attacked by the present invention is to maintain, when reducing the periodic noise, the signal/noise ratio for output signals from the sigma-delta modulator without increasing the complexity of the sigma-delta modulator.

Yet another problem attacked by the present invention is, when reducing the periodic noise when the inventive apparatus and the inventive method for sigma-delta modulation are comprised in a D/A-converter, to maintain the signal/noise ratio for output signals from the D/A-converter without increasing the complexity of the D/A-converter.

One object of the present invention is therefore to provide an apparatus and a method for sigma-delta modulation with reduced periodic noise in the modulated output signal.

Another object is to obtain, when reducing the periodic noise, a good signal/noise ratio for the output signal of the sigma-delta modulator without increasing the complexity of the sigma-delta modulator performing the modulation procedure.

The above-mentioned problems are solved according the present invention by adding two different signals to the sigma-delta modulator. The first signal has a relatively short period. Said first signal is added to one of the most significant bits of the sigma-delta modulator. The second signal has, compared to said first signal, a long period. The second signal is added to the least significant bit of one of the integrators comprised in the sigma-delta modulator.

One advantage of the inventive apparatus and the inventive method is that the reduction of periodic noise is carried out without causing a deterioration of the signal/noise ratio of the output signal from the sigma-delta modulator.

Another advantage of the present invention is that, since the complexity can be kept down when reducing the periodic noise, a sigma-delta modulator consuming relatively little power is obtained.

The invention will now be described in more detail by means of preferred embodiments and with reference to the appended drawings.

DETAILED DESCRIPTION OF PREFERRED EMBODIMENTS

Figure 1:
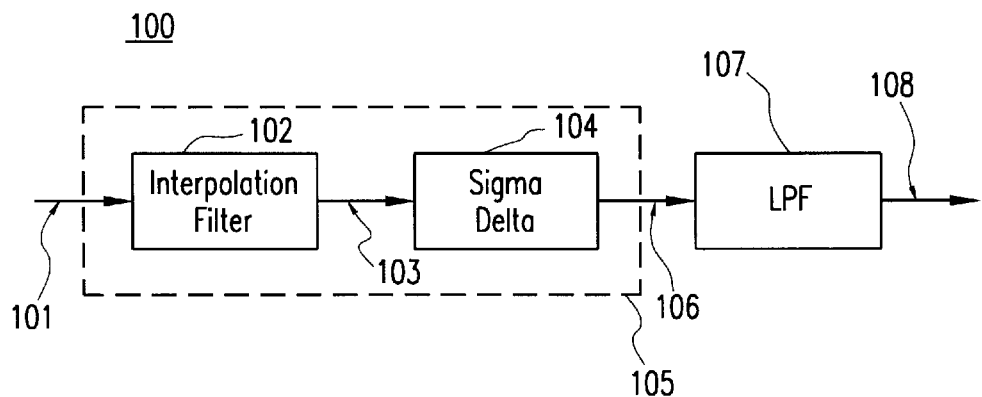
FIG. 1 is a block diagram of a D/A-converter comprising a sigma-delta modulator.

FIG. 1 is a block diagram of a D/A-converter 100 according to prior art. The D/A-converter 100 comprises a time-discrete interpolation filter 102 arranged to receive a time-discrete signal 101 comprising a number of N bits. If, for example, the D/A-converter 100 is arranged in a GSM-mobile telephone, the time-discrete signal 101 is a digital 13-bit signal. The time-discrete interpolation filter 102 increases the sampling rate of the received time-discrete signal 101 so that a new time-discrete signal 103 having a higher sampling rate is obtained. This increase of the sampling rate is carried out to obtain a better signal/noise ratio in the analogue output signals 108 received from the D/A-converter 100. The ratio between the higher sampling rate and the lower sampling rate is here called Over-Sampling Ratio (OSR). The new time-discrete signal 103 is fed to a sigma-delta modulator 104. The sigma-delta modulator 104, comprising a number of integrators and a quantifier, is arranged to generate an output signal 106. The output signal 106 can assume a previously determined number of amplitude levels. Said output signal 106 is often a 1-bit signal with only two different levels. In such a case, a conversion has been carried out from a value represented by N bits to a number of samples that can assume two different amplitude values. The time-discrete signal 106 is fed to a low-pass filter 107, arranged to even out the time-discrete 1-bit signal 106 between different amplitude values, in order to obtain the analogue signal 108 in this way.

A/D-converters function principally in the opposite way to that described above. One difference is that the D/A-converter 100 is implemented mainly with digital hardware 105, whereas the A/D-converter is implemented mainly with analogue components.

Figure 2:
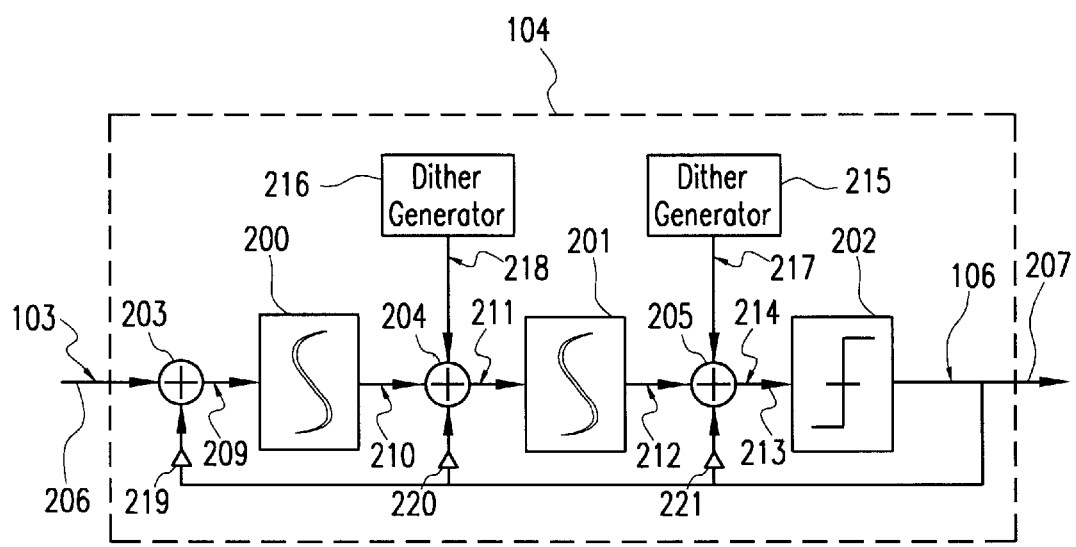
FIG. 2 is a block diagram of a sigma-delta modulator representing one embodiment of an inventive apparatus and an inventive method.

FIG. 2 is a block diagram of a sigma-delta modulator representing an embodiment of an inventive apparatus and an inventive method. The sigma-delta modulator 104 is arranged to receive the time-discrete signal 103 occurring at an input 206 of said sigma-delta modulator, and to generate the output signal 106 as an output 207 of the sigma-delta modulator. The output signal 106 is dependent on the time-discrete signal 103. The sigma-delta modulator 104 comprises two integrators 200,201, a quantifier 202, three adders 203, 204, 205, a first Dither generator 216 intended to generate a first Dither signal 218 and a second Dither generator 215 intended to generate a second Dither signal 217.

In the first Dither generator 216, which may be, for example, a memory or a shift register, the first Dither signal 218 is stored. The first Dither signal 218 is a 1-bit sequence of a previously defined amplitude and having a relatively short period. The relatively short period implies that the first Dither signal 218 does not comprise any frequency components in a frequency range intended for the D/A-converter 100. In, for example, audio devices intended for the human ear, this frequency range corresponds to the frequencies that may be perceived by the human ear, i.e. in a frequency range substantially equal to 0–20 kHz. How to select the amplitude and the period of the second Dither signal will be explained below.

From the second Dither generator 215, which may be, for example, a maximum-length shift register, the second Dither signal 217 is generated with a long period, a low amplitude and with statistic properties similar to those of white noise. How to select the length and the amplitude will be described below. The second Dither signal 217 is a 1-bit sequence which, when generated with a maximum length shift register of the length 22 and a period longer than 4 seconds, obtains statistic properties similar to those of white noise. The period of 4 seconds should here be seen as a relatively long period. This Dither signal is primarily intended to avoid the sigma-delta modulator generating an output signal having tones in the frequency range intended for the sigma-delta modulator, depending on the first Dither signal 218.

The adder 203 is arranged to add the time-discrete signal 103 to the output signal 106, which is fed back by means of a feedback connection 208 through a multiplier 219, whereby a first sum signal 209 is obtained. A multiplication factor k for the multiplier 219 is selected in a manner known in the art. If k is selected as k<0, a subtraction of said output signal from said time-discrete signal 103 is performed. Said first sum signal 209 is integrated in the integrator 200, whereby a first integrated signal 210 is obtained. The adder 204 is arranged to add said first integrated signal 210 to the output signal 106, which is fed back, through a multiplier 220, in the same way as described above. A first partial sum is obtained in this addition. The adder 204 is arranged to add the first Dither signal 218 to one of the most significant bits of the first partial sum. The additions performed in the adder can, of course, be performed in the opposite order. Thereby a second sum signal 211 is obtained. The second sum signal 211 is integrated in the integrator 201, whereby a second integrated signal 212 is obtained. The adder 205 is arranged to add the second integrated sum signal to the output signal 106, which is fed back to a multiplier 221, and to the second Dither signal 218, whereby a third sum signal 214 is obtained. The second Dither signal 218 is added to one of the least significant bits. The third sum signal occurs as an input 213 of the quantifier 202 arranged to generate the output signal 106. The output signal 106 is a signal that can assume two levels.

The output signal 106 is fed back through the three multipliers 219,220,221 with a respective multiplication factor k,l,m. The multiplication factors k,l,m may be determined in different ways. Generally, however, an analysis of transfer functions for the noise and the signal must be carried out. How to determine said multiplication coefficients is previously known by those skilled in the art.

The first Dither signal 218 is a 1-bit signal having a previously determined spectral property. The first Dither signal should not, for a predetermined sampling frequency $f_s$ of the received signal 101 and a determined OSR (OverSampling Ratio), comprise frequency components in a range $f_B$ intended for the D/A-converter 100, which may be, for example, the base band range of a mobile telephone. The length of the first Dither signal 218, to fulfil the above, should preferably be shorter than the period of the highest frequency $f_{BH}$ of the frequency range intended for the D/A-converter. This is achieved if the second Dither signal 217 is selected with a bit sequence shorter than $$\frac{1}{f_{BH}} \times f_s \times OSR \text{ bits.}$$

The human ear can perceive tones up to 20 kHz, which gives the highest frequency of D/A converters arranged, for example, in mobile telephones. Using, for example, the sampling rate $f_s$=8000 Hz and OSR=64, the requirement that the first Dither signal 218 comprise no frequency components within the frequency range audible to man is fulfilled if the first Dither signal is selected shorter than 26 bits. This is achieved by substituting the above mentioned values in the above mentioned equation:

$$\frac{1}{20000} \times 8000 \times 64 \approx 26 \text{ bits.}$$

The amplitude of the first Dither signal is preferably selected as 4–32 times lower than the amplitude of the fed back output signal. The selection of the amplitude of the first Dither signal is dependent on the structure of the sigma-delta modulator and the bit to which the first Dither signal is added. The amplitude of the first Dither signal may be simulated after the structure of the sigma-delta modulator has been determined.

The second Dither signal 217 is a bit sequence having statistic properties corresponding to those of white noise. This may be, for example a Pseudo Noise (PN) code generated by a maximum-length shift register. The period of this Dither signal should be long, preferably a few seconds. If, for example, a period of 4 seconds is desired when the sampling rate $f_s$ is equal to 8000 Hz and OSR is equal to 64, the bit sequence, the period, should be longer than 2048000 bits (4×8000×64=2048000). This sequence is obtained using a maximum-length shift register of the length 22, which gives a period of $(2^{22}-1)=4194303$. How to design a maximum-length shift register of a certain length is well known to the person skilled in the art.

The amplitude of the first Dither signal is determined by connecting the Dither generator 216 with a controllable amplitude to an adder in the sigma-delta modulator.

The amplitude is increased until no periodic noise is found in the output signal 108. This may be checked in several ways, for example by connecting a spectrum analyzer registering the frequency components of the signals, for registering the output signal 108.

In this embodiment the first Dither signal 218 as well may be connected to the adder 205 and the second Dither signal 217 may be connected to the adders 203, 204. The same result as above will be obtained.

Figure 3:
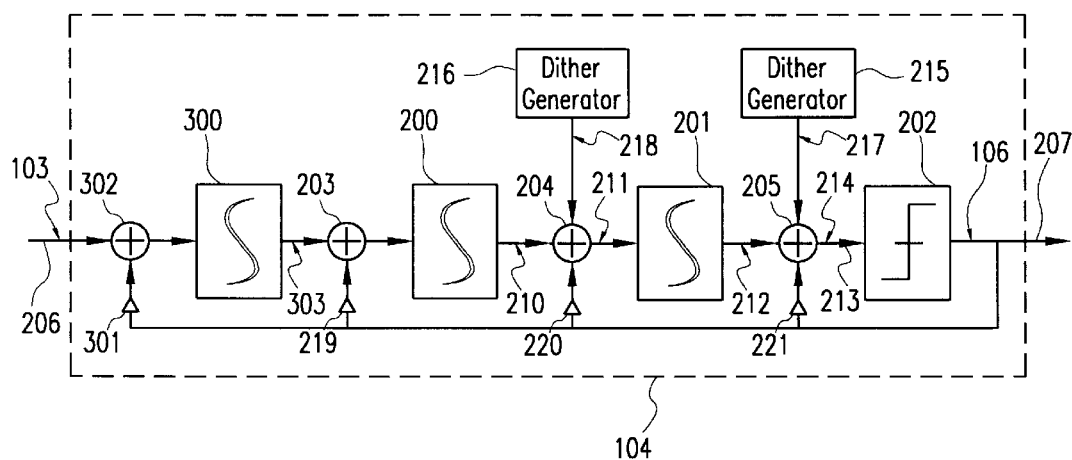
FIG. 3 is a block diagram of a sigma-delta modulator representing another embodiment of the inventive apparatus and the inventive method.

FIG. 3 is a block diagram of a sigma-delta modulator representing a second embodiment of the inventive apparatus and the inventive method. The difference between the embodiment described in connection with FIG. 2 and the one shown in FIG. 3 is that the embodiment shown in FIG. 3 comprises an additional integrator 300, and is therefore referred to as a $3^{rd}$ order sigma-delta modulator, an adder 302 and an amplifier 301.

The input signal 103 is added to the output signal 106, amplified in the amplifier 301, in the adder 302, whereby a sum signal is obtained. This sum signal is integrated in the integrator 300 generating an integrated signal 303. Instead of the input signal 103 described in connection with FIG. 2, the adder 203 thereby obtains the input signal 303. In all other respects the sigma-delta modulator functions as described above in connection with FIG. 2.

The Dither signal 217 and the Dither signal 218 used in the two embodiments described above, of course, are not exactly the same signal, but have been adjusted according to that described above.

In this embodiment the first Dither signal 218 as well may be connected to one of the adders 203, 205 and the second Dither signal 217 may be connected to one of the adders 203, 204, 302. The same result as above will be obtained.

Figure 4:
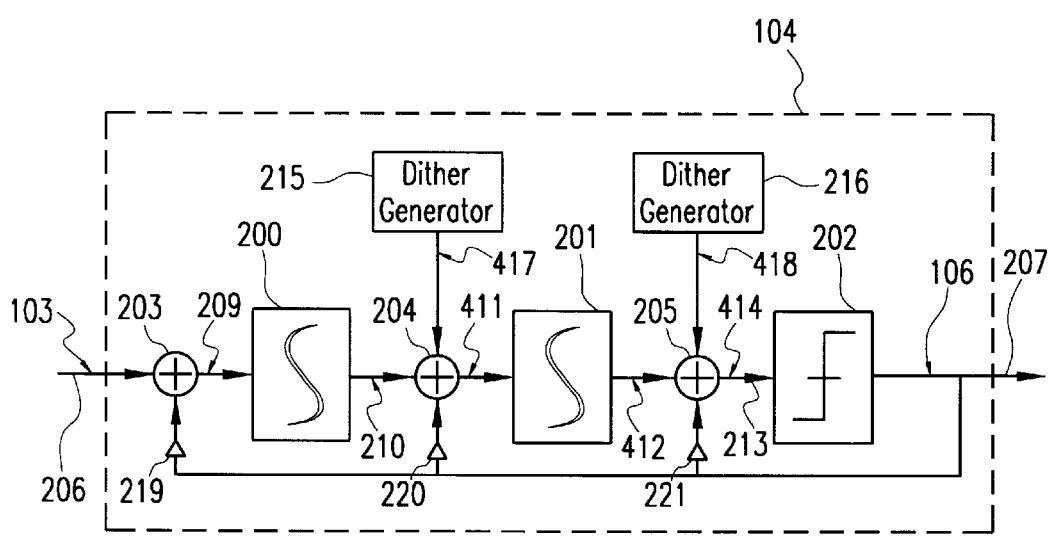
FIG. 4 is a block diagram of a sigma-delta modulator representing yet another embodiment of the inventive apparatus and the inventive method.

FIG. 4 is a block diagram of a sigma-delta modulator representing another embodiment of the inventive apparatus and the inventive method. The difference between this embodiment and the one described in connection with FIG. 2 is that the Dither generators 216, 215 have changed places. A first Dither signal 417 generated by one of the Dither generators 215 is added to the first integrated signal 210 and the output signal 106 fed back through the amplifier 220, in the adder 204, in the same way as described in connection with FIG. 2 for the Dither signal 217, whereby a second sum signal 411 is obtained. The sum signal 411 is integrated in the integrator 201, whereby a second integrated signal 412 is obtained. A second Dither signal 418 is added to the second integrated signal 412 and to the output signal 106, fed back through the amplifier 221, whereby a third sum signal 414 is obtained. Said addition is carried out in the same way as described in connection with FIG. 2 for the Dither signal 218. The output signal 106 is obtained at the output 106 in the same way as described above, by quantification 202 of the third sum signal 414.

Figure 5:
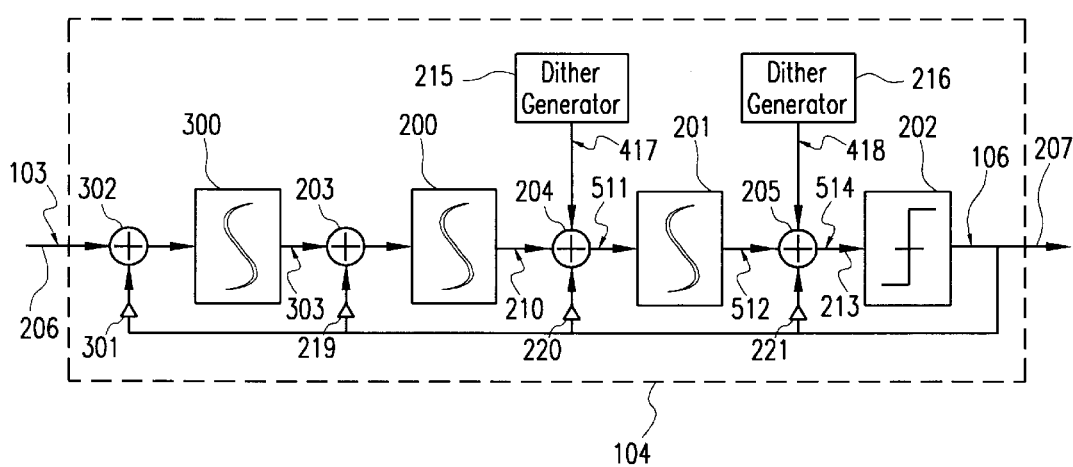
FIG. 5 is a block diagram of a sigma-delta modulator representing yet another embodiment of the inventive apparatus and the inventive method.

FIG. 5 is a block diagram of yet another embodiment of the inventive sigma-delta modulator. The difference between the one described in connection with FIG. 3 is that the Dither generators 216, 215 have changed places. The first Dither signal 417 generated by the Dither generator 215 is added to the first integrated signal 210 and to the output signal 106 fed back through the amplifier 220, in the adder 204, in the same way as described in connection with FIG. 3 for the Dither signal 217, whereby a second sum signal 511 is obtained. The sum signal 511 is integrated in the integrator 201, whereby a second integrated signal 512 is obtained. The second Dither signal 418 is added to the second integrated signal 512 and to the output signal 106, fed back through the amplifier 221, whereby a third sum signal 514 is obtained. Said addition is carried out in the same way as described in connection with FIG. 3 for the Dither signal 218. The output signal 106 is obtained at the output 106 in the same way as described above, by quantification 202 of the third sum signal 414.

The invention is of course not limited to the ones described above and shown in the drawings, but may be modified within the scope of the claims.

What is claimed is:

1. A method of sigma-delta modulation comprising the steps of:
    performing at least a first integration of a first signal to obtain a first integrated signal, the first signal formed by multiplying an output signal by a predetermined factor k and adding a modulator input signal;
    performing at least a second integration of a second signal to obtain a second integrated signal, said second signal formed by adding said first integrated signal to a first input signal from a first dither generator;
    quantifying a third signal to obtain said output signal, said third signal formed by adding said second integrated signal to a second input signal from a second dither generator; and
    wherein the first input signal repeats itself in accordance with a first period, and the second input signal repeats itself in accordance with a second period, the first period being different than the second period.

2. The method according to claim 1, wherein the first input signal is a particular bitmap of the first period, and further wherein, the second input signal is a pseudo-random signal of the second period.

3. The method according to claim 1, wherein the second signal is formed by the further addition of a product of said output signal multiplied by a predetermined factor l and the third signal is formed by the further addition of the product of said output signal multiplied by a predetermined factor m.

4. The method according to claim 1, wherein the first input signal is a pseudo-random signal of the first period, and further wherein, the second input signal is a particular bitmap of the second period.

5. The method according to claim 1, wherein the first input signal is a one-bit time discrete sequence of the first period, which is short relative to the second period of said second input signal, and further wherein, the second input signal is a one-bit time discrete sequence of the second period.

6. The method according to claim 5, wherein the first period of the first input signal is such that its frequency components lie outside a frequency range of the sigma-delta modulator and the second period of the second input signal is sufficiently long that the sequence repeats itself with a frequency inaudible to humans.

7. The method according to claim 6, wherein the frequency range of the sigma-delta modulator is audible to humans and the first period of the first input signal repeats itself with a frequency inaudible to humans.

8. The method according to claim 5, wherein said modulator input signal and said first integrated signal are N-bit time discrete signals and said output signal is a one-bit time discrete signal, and wherein the method further includes the steps of:

adding the first input signal to a higher order bit in said first integrated signal; and adding the second input signal to a least significant bit in the second integrated signal.

9. The method according to claim 8, wherein the first period of the first input signal is such that its frequency components lie outside a frequency range of the sigma-delta modulator and the second period of the second input signal is sufficiently long that the sequence repeats itself with a frequency inaudible to humans.

10. The method according to claim 9, wherein the frequency range of the sigma-delta modulator is audible to humans and the first period of the first input signal repeats itself with a frequency inaudible to humans.

11. The method according to claim 1, wherein the first input signal is a one-bit time discrete sequence of the first period, and further wherein, the second input signal is a one-bit time discrete sequence of the second period, which is short relative to the first period of said first input signal.

12. The method according to claim 11, wherein the first period of the first input signal is sufficiently long that the sequence repeats itself with a frequency inaudible to humans and the second period of the second input signal is such that its frequency components lie outside a frequency range of the sigma-delta modulator.

13. The method according to claim 12, wherein the frequency range of the sigma-delta modulator is audible to humans and the second period of the second input signal repeats itself with a frequency inaudible to humans.

14. The method according to claim 11, wherein said modulator input signal and said first integrated signal are N-bit time discrete signals and said output signal is a one-bit time discrete signal, and wherein the method further includes the steps of:

adding the first input signal to a least significant bit in the first integrated signal; and adding the second input signal to a higher order bit in said second integrated signal.

15. The method according to claim 14, wherein the first period of the first input signal is sufficiently long that the sequence repeats itself with a frequency inaudible to humans and the second period of the second input signal is such that its frequency components lie outside a frequency range of the sigma-delta modulator.

16. The method according to claim 15, wherein the frequency range of the sigma-delta modulator is audible to humans and the second period of the second input signal repeats itself with a frequency inaudible to humans.

17. A method of digital/analogue conversion of an N bit time discrete signal to an analogue signal comprising the steps of:

interpolation filtering of the N bit time discrete signal with a particular sampling rate to obtain a time discrete signal having a certain higher sampling rate;

sigma-delta modulating the time discrete signal with said higher sampling rate to obtain an output signal having a certain number of amplitude levels, said sigma-delta modulating comprising the steps of:

performing at least a first integration of a first signal to obtain a first integrated signal, the first signal formed by multiplying the output signal by a predetermined factor k and adding the time discrete signal;

performing at least a second integration of a second signal to obtain a second integrated signal, said second signal formed by adding said first integrated signal to a first input signal comprising a particular bitmap of a first period; and quantifying a third signal to obtain said output signal, said third signal formed by adding said second integrated signal to a second input signal comprising a pseudo-random signal of a second period, the first period being different than the second period; and low-pass filtering said output signal to obtain an analogue signal corresponding to the N-bit time discrete signal.

18. A method of digital/analogue conversion of an N bit time discrete signal to an analogue signal comprising the steps of:

interpolation filtering of the N bit time discrete signal with a particular sampling rate to obtain a time discrete signal having a certain higher sampling rate;

sigma-delta modulating the time discrete signal with said higher sampling rate to obtain an output signal having a certain number of amplitude levels, said sigma-delta modulating comprising the steps of:

performing at least a first integration of a first signal to obtain a first integrated signal, the first signal formed by multiplying the output signal by a predetermined factor k and adding the time discrete signal;

performing at least a second integration of a second signal to obtain a second integrated signal, said second signal formed by adding said first integrated signal to a first input signal comprising a pseudo-random signal of a first period;

quantifying a third signal to obtain said output signal, said third signal formed by adding said second integrated signal to a second input signal comprising a particular bitmap of a second period, the first period being different than the second period; and low-pass filtering said output signal to obtain an analogue signal corresponding to the N-bit time discrete signal.

19. An apparatus for digital/analogue conversion of an N-bit time discrete signal to an analogue signal comprising:

an interpolation filter for filtering the N-bit time discrete signal with a certain sampling rate to obtain a time discrete signal having a certain higher sampling rate;

a sigma-delta modulator for modulating the time discrete signal with said higher sampling rate to obtain an output signal having a certain number of amplitude levels, said sigma-delta modulator comprising:

at least one first integrator for integration of a first signal to obtain a first integrated signal, the first signal formed by multiplying the output signal by a predetermined factor k and adding the time discrete signal;

at least one second integrator for integration of a second signal to obtain a second integrated signal, said second signal formed by adding said first integrated signal to a first input signal;

a quantifier for quantifying a third signal to obtain said output signal, said third signal formed by adding said second integrated signal to a second input signal;

a first Dither generator for generating the first input signal, said first Dither generator comprising a particular bitmap of a first period; and a second Dither generator for generating the second input signal, said second Dither generator comprising a pseudo-random signal of a second period, the first period being different than the second period; and a low-pass filter for filtering said output signal to obtain the analogue signal corresponding to the N-bit time discrete signal.

20. An apparatus for the digital/analogue conversion of an N-bit time discrete signal to an analogue signal comprising:

an interpolation filter for filtering the N-bit time discrete signal with a certain sampling rate to obtain a time discrete signal of a certain higher sampling rate;

a sigma-delta modulator for modulating the time discrete signal with said higher sampling rate to obtain an output signal having a certain number of amplitude levels said sigma-delta modulator comprising:

at least one first integrator for integration of a first signal to obtain a first integrated signal, the first signal formed by multiplying the output signal by a predetermined factor k and adding a time discrete signal;

at least one second integrator for integration of a second signal to obtain a second integrated signal, said second signal formed by adding said first integrated signal to a first input signal;

a quantifier for quantifying a third signal to obtain said output signal, said third signal formed by adding said second integrated signal to a second input signal;

a first Dither generator for generating the first input signal, said first Dither generator comprising a pseudo-random signal of a first period; and a second Dither generator for generating the second input signal, said second Dither generator comprising a particular bitmap of a second period, the first period being different than the second period; and a low-pass filter for filtering said output signal to obtain the analogue signal corresponding to the N-bit time discrete signal.

21. A method of sigma-delta modulation comprising the steps of:

performing at least a first integration of a first signal to obtain a first integrated signal, the first signal formed by multiplying an output signal by a predetermined factor k and adding a modulator input signal;

performing at least a second integration of a second signal to obtain a second integrated signal, said second signal formed by adding said first integrated signal directly to a first dither signal without filtering the first dither signal;

quantifying a third signal to obtain said output signal, said third signal formed by adding said second integrated signal directly to a second input signal without filtering the second dither signal; and wherein the first dither signal has a bit sequence less than $$\frac{1}{f_{BH}} \times f_s \times OSR \text{ bits}$$

and the second dither signal has a bit sequence longer than $4 \times f_s \times OSR$ bits.

22. An apparatus for sigma-delta modulation, comprising:

at least one first integrator for integration of a first signal to obtain a first integrated signal, the first signal formed by multiplying an output signal by a predetermined factor k and adding a modulator input signal;

at least one second integrator for integration of a second signal to obtain a second integrated signal, said second signal formed by adding said first integrated signal to a first input signal;

a quantifier for quantifying a third signal to obtain said output signal, said third signal formed by adding said second integrated signal to a second input signal;

a first Dither generator for generating the first input signal such that the first input signal repeats itself in accordance with a first period; and a second Dither generator for generating the second input signal such that the second input signal repeats itself in accordance with a second period, the first period being different than the second period.

23. The apparatus according to claim 22, wherein the first Dither generator comprises a particular bitmap of the first period, and further wherein, the second Dither generator comprises a pseudo-random signal of the second period.

24. The apparatus according to claim 22, wherein the first Dither generator comprises a memory, and further wherein, the second Dither generator comprises a maximum length shift register.

25. The apparatus according to claim 22, wherein the first Dither generator comprises a shift register, and further wherein, the second Dither generator comprises a maximum length shift register.

26. The apparatus according to claim 22, further comprising:

a first adder for adding said output signal multiplied by a predetermined factor l to the first integrated signal; and a second adder for adding said output signal multiplied by a predetermined factor m to the second integrated signal.

27. The apparatus according to claim 22, wherein the first Dither generator comprises a pseudo-random signal of the first period, and further wherein, the second Dither generator comprises a particular bitmap of the second period.

28. The apparatus according to claim 22, wherein the first Dither generator comprises a maximum length shift register, and further wherein, the second Dither generator comprises a memory.

29. The apparatus according to claim 22, wherein the first Dither generator comprises a maximum length shift register, and further wherein, the second Dither generator comprises a shift register.

* * * * *

UNITED STATES PATENT AND TRADEMARK OFFICE
CERTIFICATE OF CORRECTION

PATENT NO.     : 6,175,321 B1
DATED          : January 16, 2001
INVENTOR(S)    : Frännhagen et al.

It is certified that error appears in the above-identified patent and that said Letters Patent is hereby corrected as shown below:

Column 1,
Line 25, replace "EP 0709959 A2" with -- EP 0709969 A2 --

Signed and Sealed this

Tenth Day of December, 2002

JAMES E. ROGAN
*Director of the United States Patent and Trademark Office*